(12) United States Patent
Chen et al.

(10) Patent No.: US 8,618,797 B2
(45) Date of Patent: Dec. 31, 2013

(54) COMPOSITE SPIN LOCKING PULSE SEQUENCE AND METHOD OF USING THE SAME

(75) Inventors: Weitian Chen, Menlo Park, CA (US); Eric Han, Menlo Park, CA (US)

(73) Assignee: General Electric Company, Schenectady, NY (US)

(*) Notice: Subject to any disclaimer, the term of this patent is extended or adjusted under 35 U.S.C. 154(b) by 378 days.

(21) Appl. No.: 12/842,946

(22) Filed: Jul. 23, 2010

(65) Prior Publication Data

US 2012/0019244 A1  Jan. 26, 2012

(51) Int. Cl.
*G01R 33/46* (2006.01)
(52) U.S. Cl.
USPC .............. 324/307; 324/318; 324/314
(58) Field of Classification Search
USPC .................. 324/300–322; 600/407–435; 382/128–131
See application file for complete search history.

(56) References Cited

U.S. PATENT DOCUMENTS

| | | | | |
|---|---|---|---|---|
| 3,004,166 | A * | 10/1961 | Greene | 250/202 |
| 4,820,983 | A * | 4/1989 | Bendall et al. | 324/307 |
| 5,614,826 | A | 3/1997 | Dixon | |
| 6,836,114 | B2 | 12/2004 | Reddy et al. | |
| 7,400,145 | B2 | 7/2008 | Han | |
| 7,642,777 | B1 | 1/2010 | Meyer et al. | |
| 7,705,596 | B2 | 4/2010 | Witschey et al. | |
| 7,920,972 | B2 * | 4/2011 | Szyperski et al. | 702/27 |
| 2006/0111846 | A1 * | 5/2006 | Szyperski et al. | 702/19 |
| 2012/0019244 | A1 * | 1/2012 | Chen et al. | 324/309 |

OTHER PUBLICATIONS

Charagundla et al., Artifacts in T1rho-Weighted Imaging: Correction With a Self-Compensating Spin-Locking Pulse. Journal of Magnetic Resonance, 2003, 162: 113-121, Academic Press: Philadelphia, PA.
Chen et al., Quantitative T1rho Imaging Using Phase Cycling for B0 and b1 Field Inhomogeneity Compensation. MR Applied Science Lab, GE Healthcare, Menlo Park, CA. Date Unknown.
Dixon et al., Myocardial Suppression In Vivo by Spin Locking with Composite Pulses. Magnetic Resonance in Medicine. Dec. 2005, 36(1): 90-94, Frederik Philips Magnetic Resonance Research Center: Atlanta, GA.
Grohn et al., Early Detection of Irreversible Cerebral Ischemia in the Rat Using Dispersion of the magnetic Resonance Imaging Relaxation Time T1rho. Journal of Cerebral Blood Flow and Metabolism, 2000, 20:1457-1466, Lippincott Williams & Wilkins, Inc.: Philadelphia, PA.
Witsche Y et al., Artifacs in T1 rho -Weighed Imaging: Compensaton for B1 and B0 Field Imperections. Jounal of Magnetic Resonance, May 2007, 186(1): 75-85, Elsevier: Philadelphia, PA.

(Continued)

*Primary Examiner* — Melissa Koval
*Assistant Examiner* — Tiffany Fetzner
(74) *Attorney, Agent, or Firm* — Fletcher Yoder, P.C.

(57) ABSTRACT

Present embodiments are directed towards a magnetic resonance imaging method. In one embodiment, the method includes (a) performing a first magnetic resonance imaging sequence including: (i) a first preparatory composite spin locking pulse sequence having a spin lock pulse bounded by similarly oriented spin tipping pulses; and (ii) an acquisition pulse sequence to acquire first magnetic resonance data. The method further includes (b) performing a second magnetic resonance imaging sequence including: (i) a second preparatory composite spin locking pulse sequence having a spin lock pulse bounded by oppositely oriented spin tipping pulses; and (ii) an acquisition pulse sequence to acquire second magnetic resonance data. The method also includes (c) storing the first and second magnetic resonance data.

20 Claims, 5 Drawing Sheets

(56) References Cited

OTHER PUBLICATIONS

Wright, G.A., et al.; "Preserving T1 and T2 Contrast in Magnetization Preparation Sequences", Proceedings of the 4th Annual Meeting of the ISMRM, 1474, 1996, 2 pages.

Li, X., et al.; "In Vivo 3T Spiral Imaging Based Multi-Slice T1ρ Mapping of Knee Cartilage in Osteoarthritis", Magn. Reson. Med. 54:929-936, 2005.

Zeng, H., et al.; "A Composite Spin-Lock Pulse for 80 + 81 Insensitive T1rho Measurement", Proceedings of the 14th Annual Meeting of the ISMRM, 2356, 2006, 1 page.

Li, X., et al.; "In Vivo T1ρ Mapping in Cartilage Using 3D Magnetization-prepared Angle-modulated Partitioned k-space Spoiled Gradient Echo Snapshots (3D MAPSS)"; Magn. Reson. Med., 59:298-307, 2008.

* cited by examiner

COMPOSITE SPIN LOCKING PULSE SEQUENCE AND METHOD OF USING THE SAME

BACKGROUND OF THE INVENTION

The present invention relates to magnetic resonance imaging pulse sequences, and more specifically, to techniques for generating T1ρ-weighted images.

In general, magnetic resonance imaging (MRI) examinations are based on the interactions among a primary magnetic field, a radiofrequency (RF) magnetic field, and time varying magnetic gradient fields with gyromagnetic material having nuclear spins within the subject of interest. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession and during relaxation, RF fields are emitted by the spinning, precessing nuclei and are detected by either the same transmitting RF coil, or by a separate coil. These signals are amplified, filtered, and digitized. The digitized signals are then processed using one or more algorithms to reconstruct a useful image.

The contrast of the images so produced may be controlled via one or more pulse sequences played out by the gradient and/or RF coils. For example, a pulse sequence may be configured to generate a T1-weighted image or a T2-weighted image, with the weighting being a result of the spin relaxation parameter that is either avoided or magnified. The weighting of different spin relaxation parameters may result in images having useful information about a given tissue, such as blood saturation, tissue density, macromolecular content, and so on. However, the successful implementation of the pulse sequences that allow the generation of weighted images may be highly sensitive to inhomogeneities in the field generated by the coils and/or inhomogeneities in the gross magnetic field.

As these inhomogeneities are mostly equipment-related, they are typically unavoidable. Further, while active or passive shimming may partially correct for these, pulse sequences that correct for or cancel out such inhomogeneities are desirable. However, current techniques for performing these corrections are often inadequate, such that they do not completely correct for field inhomogeneity, or are subject to further improvement.

BRIEF DESCRIPTION OF THE INVENTION

In one embodiment, a magnetic resonance imaging method is provided. The method includes (a) performing a first magnetic resonance imaging sequence including: (i) a first preparatory composite spin locking pulse sequence having a spin lock pulse bounded by similarly oriented spin tipping pulses; and (ii) an acquisition pulse sequence to acquire first magnetic resonance data. The method further includes (b) performing a second magnetic resonance imaging sequence including: (i) a second preparatory composite spin locking pulse sequence having a spin lock pulse bounded by oppositely oriented spin tipping pulses; and (ii) an acquisition pulse sequence to acquire second magnetic resonance data. The method also includes (c) storing the magnetic resonance data.

In another embodiment, a magnetic resonance imaging method is provided that includes (a) performing a first magnetic resonance imaging sequence including: (i) a first preparatory composite spin locking pulse sequence having a spin lock pulse bounded by similarly oriented spin tipping pulses; and (ii) an image acquisition pulse sequence to acquire first magnetic resonance data. The method further includes (b) performing a second magnetic resonance imaging sequence including: (i) a second preparatory composite spin locking pulse sequence having a spin lock pulse bounded by oppositely oriented spin tipping pulses; and (ii) an acquisition pulse sequence to acquire second magnetic resonance data. The method also includes (c) generating difference data on a pixel-by-pixel basis from the first and second data as the data is collected; and (d) storing the difference image.

In a further embodiment, a magnetic resonance imaging system is provided. The system includes a primary field magnet, a set of gradient field coils, a radiofrequency field coil, and control circuitry coupled to the gradient field coils and to the radiofrequency field coil, the control circuitry configured to apply control signals to the gradient and radiofrequency coils to perform a magnetic resonance imaging sequence. The sequence includes (a) a first magnetic resonance imaging sequence including (i) a first preparatory composite spin locking pulse sequence having a spin lock pulse bounded by similarly oriented spin tipping pulses; and (ii) an acquisition pulse sequence to acquire first magnetic resonance data. The sequence further includes (b) a second magnetic resonance imaging sequence having (i) a second preparatory composite spin locking pulse sequence having a spin lock pulse bounded by oppositely oriented spin tipping pulses; and (ii) an acquisition pulse sequence to acquire second magnetic resonance data. The system also includes processing circuitry configured to determine difference data from the first and second magnetic resonance data to characterize T1ρ data for a subject of interest.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
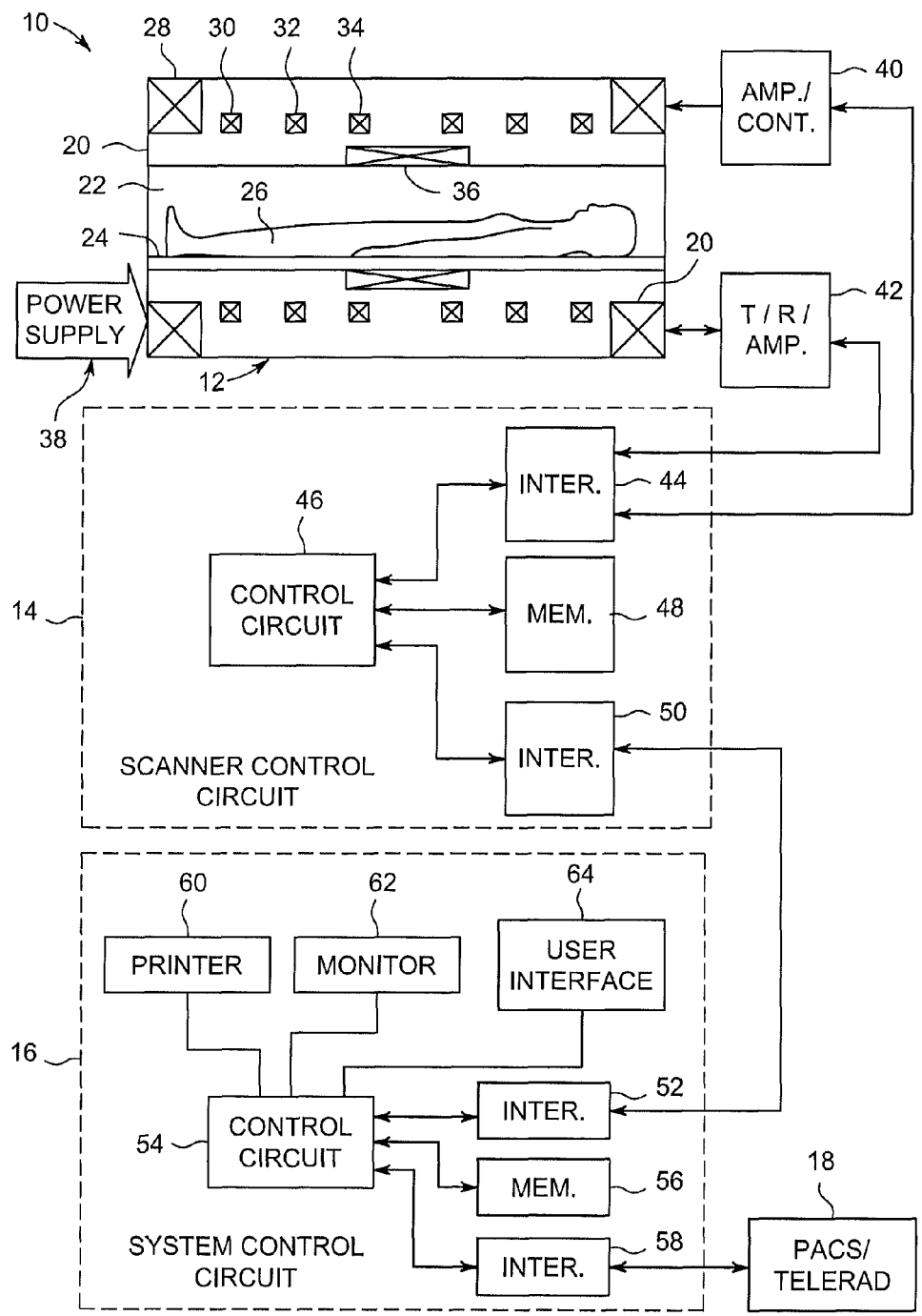
FIG. 1 is a schematic illustration of an embodiment of a magnetic resonance imaging system configured to perform pulse sequences to generate T1ρ weighted images, in accordance with one aspect of the present disclosure.

One weighting parameter of interest, the T1ρ relaxation parameter, has the potential to measure processes such as cartilage degeneration, which may be important for making clinical diagnoses. Due to its sensitivity to changes in macromolecular content, T1ρ is a potential surrogate marker for the early detection of osteoarthritis and similar conditions. T1ρ imaging involves the collection of images from gyromagnetic material that has been influenced by spin locking. In T1ρ imaging, the spins are tipped into the transverse plane in one axis. A low amplitude spin-locking RF pulse is then applied along the same axis. During the spin-locking period, the spins relax with a time constant T1ρ along the direction of the spin-locking RF pulse in the transverse plane. By acquiring a series of T1ρ weighted images at various spin-locking RF pulse durations, T1ρ values may be measured. Such a T1ρ imaging method, however, assumes that B1 RF inhomogeneity is ignorable and that B0 magnetic field inhomogeneity is much smaller than the B1 amplitude of the applied spin-locking RF pulse. The violation of these conditions can lead to T1ρ quantification errors and artifacts, which typically appear as banding in the resulting images. Indeed, in situations where such inhomogeneity is present, the spin locking pulse may not necessarily be applied parallel to the transverse magnetization axis, which may further exacerbate T1ρ quantification errors.

The present embodiments are directed towards the combination of two composite spin locking pulse sequences and methods of using the pulse sequences for T1ρ imaging. As generally defined herein, a composite spin locking pulse sequence may include a pulse sequence having spin tipping pulses bounding the spin locking pulse. Specifically, in one embodiment, a 90 degree RF pulse is applied to tip down magnetization into the transverse plane along the X axis. A hard pulse is then applied along the Y-axis with a certain flip angle (e.g., about 135°). A spin-lock RF pulse is then applied along the Y-axis with a certain duration and spin lock frequency. It should be noted that the phase of the spin-lock RF pulse remains constant throughout the pulse. At the end of the spin-lock RF pulse, another hard pulse is applied with a certain flip angle (e.g., 135°) along the Y-axis. After the hard pulse, a 90° RF pulse is applied to tip the magnetization back to the longitudinal direction along the Z-axis. A crusher gradient follows to eliminate magnetization in the transverse plane. Image acquisition (segmented or single shot, 2D or 3D) immediately follows the crusher gradient. In a second preparatory sequence, this set of pulses is then repeated, but either the last pulse (i.e., the second 90° pulse) is modified to tip the magnetization along the −Z-axis or an inversion pulse (possibly composite) is added immediate after the second 90° pulse and immediately prior to the crusher gradient.

The two pulse sequences result in two sets of acquired magnetic resonance data, which are then subtracted from each other. Several such data sets may be acquired using different Time of Spin-Lock (TSL) The T1ρ values may be calculated on a pixel-by-pixel basis by fitting the magnitude of the images after subtraction to an exponential time decay model.

Technical effects of the invention can provide improved image quality for T1ρ weighted imaging and also more robust and accurate $T_1\rho$ quantification when there is B0 magnetic field inhomogeneity and/or B1 RF inhomogeneity. Since B0 magnetic field inhomogeneity and B1 RF inhomogeneity are common MRI system imperfections, embodiments of the present invention make $T_1\rho$ imaging more feasible for regular clinical diagnoses.

The embodiments described herein may be performed by a magnetic resonance imaging (MRI) system, wherein specific imaging routines (e.g., T1ρ imaging routines) are initiated by a user (e.g., a radiologist). Further, the MRI system may perform preparatory pulse sequences followed by data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as accelerated imaging sequences. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is movable into the bore 22 to permit a subject 26 to be positioned therein for imaging selected anatomy within the patient.

Scanner 12 includes a series of associated coils for producing controlled magnetic field and for detecting emissions from gyromagnetic material within the anatomy of the subject being imaged. A primary magnet coil 28 is provided for generating a primary magnetic field (B0) that is generally aligned with the bore 22. A series of gradient coils 30, 32, and 34 permit controlled magnetic gradient fields to be generated during examination sequences. A radio frequency (RF) coil 36 is provided for generating radio frequency pulses (B1 RF) for exciting the gyromagnetic material, such as for spin preparation, relaxation weighting, spin perturbation or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

Scanner control circuit 14 includes an interface circuit 44 which outputs signals for driving the gradient field coils and the RF coil and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. For example, the programming code may execute one or more algorithms capable of performing T1ρ quantification, T1ρ mapping and overlay, and so forth, which will be discussed in detail below. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith provide control signals to produce magnetic fields and radio frequency pulses in a controlled manner to excite and encode specific gyromagnetic material within the subject 26. The scanner 12 and control circuit 46 also sense the signals emanating from such material and create an image of the material being scanned. In certain embodiments, the scan may T1ρ weighted. It should be noted that the MRI system described is merely intended to be exemplary, and other system types, such as so-called "open" MRI systems may also be used. Similarly, such systems may be rated by the strength of their primary magnet, and any suitably rated system capable of carrying out the data acquisition and processing described below may be employed.

Figure 2:
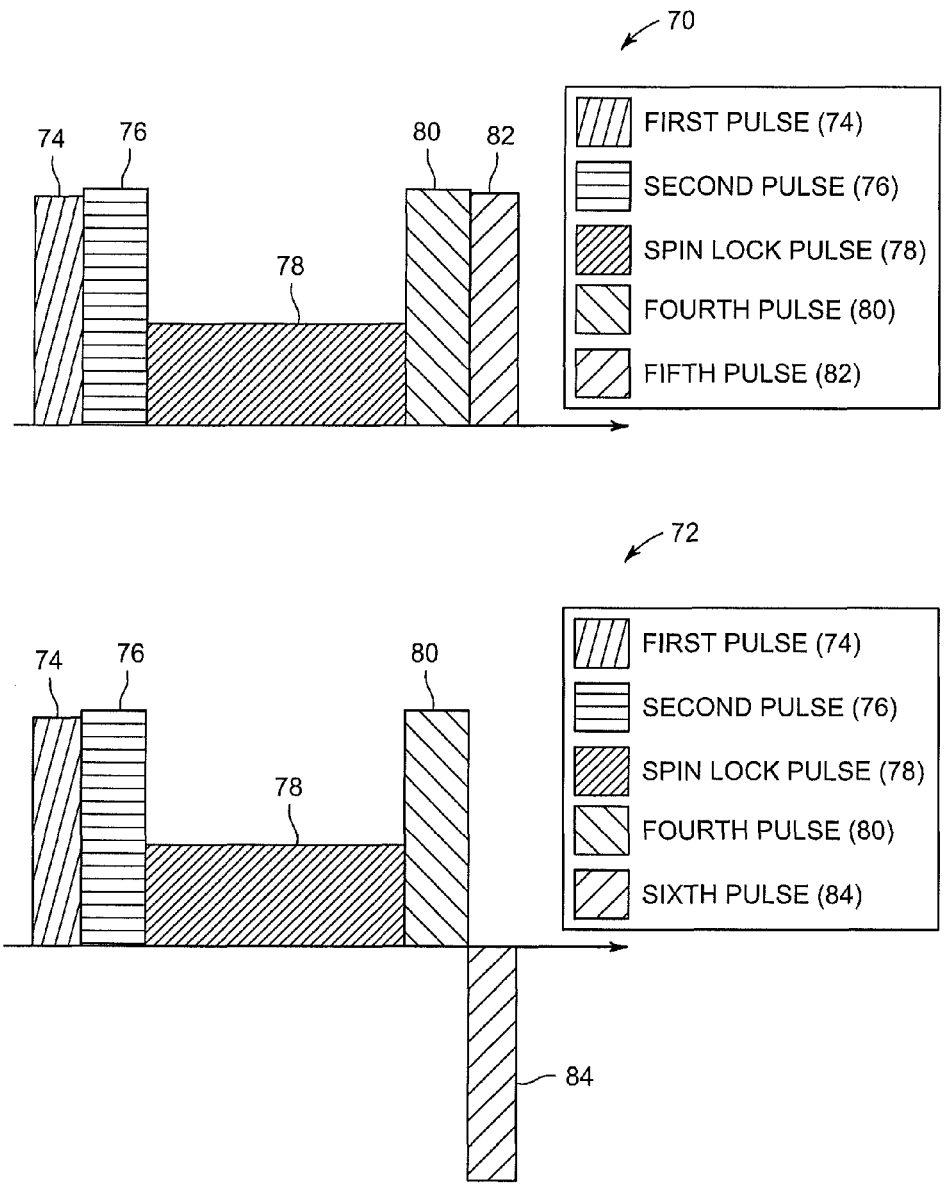
FIG. 2 is a diagram of a first pulse sequence and a second pulse sequence that, when subtracted, can correct B0 and B1 RF inhomogeneities in T1ρ imaging processes, in accordance with an aspect of the present disclosure.

To perform the T1ρ weighted imaging introduced above, the MRI system 10 may perform pulse sequences that are configured to reduce or altogether remove undesirable behavior of the gyromagnetic material of interest, such as behavior resulting from B0 and B1 RF inhomogeneities. Further, the pulse sequences according to present embodiments may allow a reduction or an altogether elimination of T2ρ contamination, which, when not reduced or eliminated, can result in errors when performing T1ρ quantification. Specifically, the present embodiments involve performing two preparatory pulse sequences, where a first preparatory pulse sequence is performed before a first data acquisition and a second preparatory pulse sequence is performed after the first data acquisition and before a second data acquisition. The data may be magnetic resonance data representative of a subject of interest. Examples of such pulse sequences are provided in FIG. 2, which is a pulse sequence diagram of a first preparatory pulse sequence 70 and a second preparatory pulse sequence 72.

The first preparatory pulse sequence 70 and the second preparatory pulse sequence 72 both include a spin locking pulse bounded by spin tipping and magnetization alignment pulses. Further, the preparatory pulse sequences 70, 72 do not include phase inversion during the spin lock pulse. In the illustrated embodiment, the first preparatory pulse sequence 70 and second preparatory pulse sequence 72 include a first pulse 74 that is configured to tip the magnetization vector into the transverse plane along the X-axis. For example, the first pulse 74 may be a 90° spin tipping pulse. A second pulse 76 is then played along the Y-axis. As an example, the second pulse 76 may tip the spin angle by between approximately 135 and 180° (e.g., about 135°, 145°, 160°, 170°, 180°). A spin locking pulse 78 is then applied along the Y-axis. It should be noted that the duration of the spin locking pulse 78 may be varied, along with its frequency and amplitude. However, as mentioned, no phase alternation is used during the spin lock pulse 78. According to present embodiments, the duration of the spin locking pulse 78 may determine the magnitude of T1ρ weighting.

After the end of the spin lock pulse 78, a fourth pulse 80 is performed. The fourth pulse 80 is generally along the Y-axis, and is configured to substantially re-align the magnetization of any out-of-phase signals. In one embodiment, the fourth pulse 80 may tip the spin angle by between approximately 135 and 180°, as described above. In the first preparatory pulse sequence 70, a fifth pulse 82 is performed, which tips the magnetization back to the longitudinal direction, but along the −Z-axis. As an example, the fifth pulse 82 may tip the magnetization by about 90°. Therefore, in the first preparatory pulse sequence 70, the spin locking pulse 78 is bounded by similarly oriented spin tipping pulses.

In the second preparatory pulse sequence 72, instead of performing the fifth pulse 82 as in the first preparatory pulse sequence 70, a sixth pulse 84 is performed wherein the magnetization is tipped towards the Z-axis. Thus, the second preparatory pulse sequence 72 has the spin lock pulse 78 bounded by oppositely oriented spin tipping pulses. Alternatively, rather than performing the sixth pulse 84, the fifth pulse 82 may also be performed during the second preparatory pulse sequence 72. In this case, the fifth pulse 82 is followed substantially immediately by an inversion pulse (such as a composite inversion pulse). It should be noted that while the pulse sequences 70 and 72 are illustrated as having no gaps between the pulses, that gaps in between any of the pulses is also contemplated herein. As an example, gaps between the pulses may be intentional gaps for pulse coding and/or relaxation purposes, unintentional gaps resulting from mechanical imperfections and constraints, and the like.

Again, the first preparatory pulse sequence 70 is performed prior to acquisition of a first set of magnetic resonance data, which is then followed by the second preparatory pulse sequence 72, which is performed prior to acquisition of a second set of magnetic resonance data. After each preparatory pulse sequence, a crusher gradient may be provided, for example to eliminate magnetization in the transverse plane. Data acquisition is performed after application of the crusher gradient. According to present embodiments, performing the first preparatory pulse sequence 70 followed by data acquisition results in a first T1ρ weighted data set. Likewise, performing the second preparatory pulse sequence 72 followed by data acquisition results in a second T1ρ weighted data set. As noted above, however, B1 RF inhomogeneities cause banding artifacts as well as T2ρ contamination. Therefore, the present embodiments are directed towards minimizing or eliminating such B1 RF inhomogeneities in addition to B0 inhomogeneity correction. According to the present approaches, B1 RF inhomogeneity compensation may be achieved by subtracting one data set from the other, as described in detail below.

Figure 3:
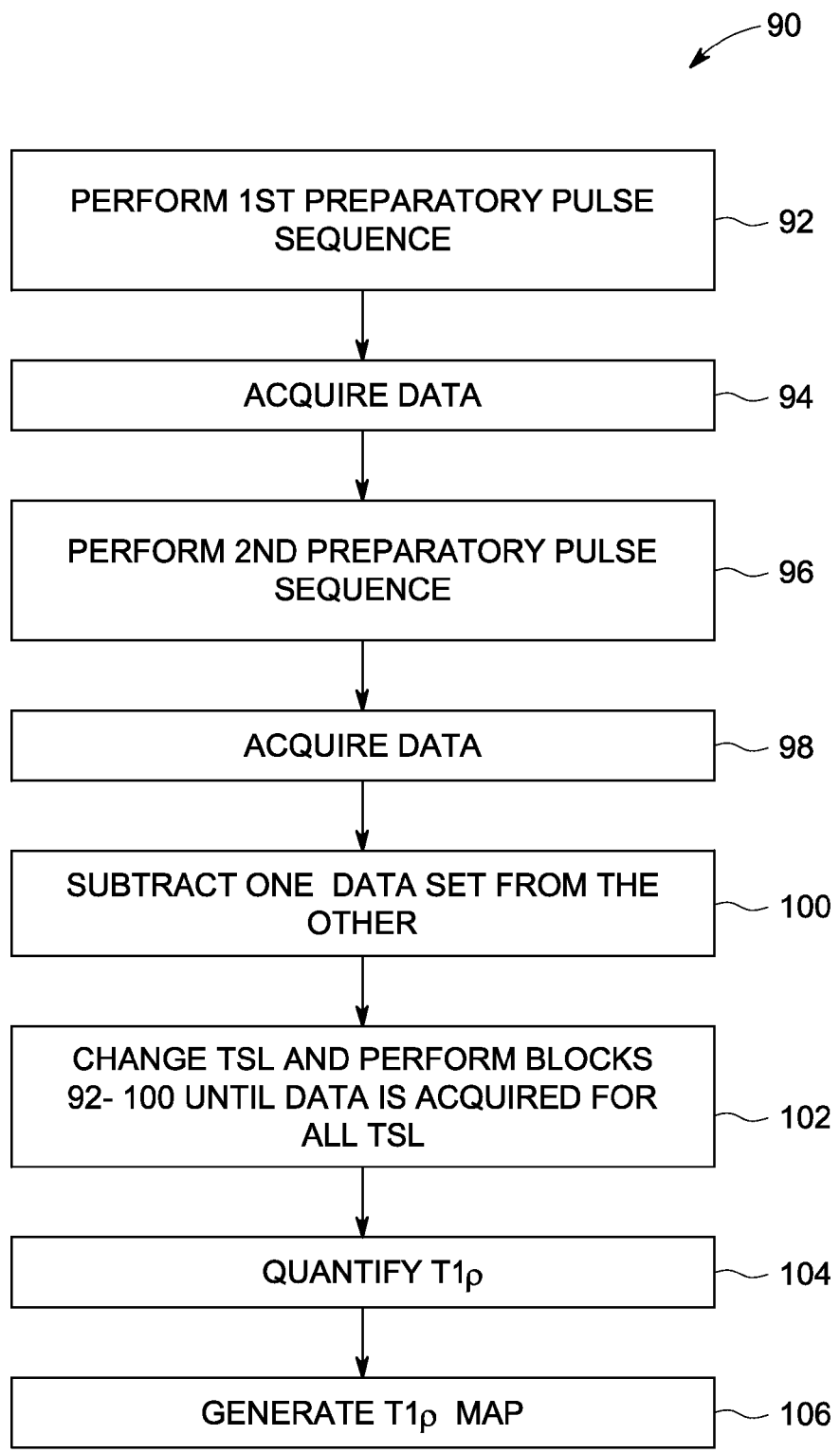
FIG. 3 is a process flow diagram of a method of performing T1ρ quantification using the pulse sequences of FIG. 2, in accordance with an aspect of the present disclosure.

B0 and B1 RF inhomogeneity compensation may be paramount to T1ρ imaging and quantification processes and their subsequent use for clinical diagnoses, which require a high degree of reliability. Such a quantification process is represented in FIG. 3, which is a process flow diagram of a method 90 for generating T1ρ quantification/imaging data. It should be noted that at least a portion of the method 90 presented in FIG. 3 may be performed by suitably configured processing circuitry, such as the control circuitry 54 described in FIG. 1. In a first step of the method 90, the first preparatory pulse sequence 70 is performed (block 92). After elimination of any remaining transverse magnetization with a crusher gradient, magnetic resonance data of the subject of interest is acquired (block 94). The magnetic resonance data may include single slice 2D acquisition data, multi-slice acquisition data, or 3D acquisition data. As an example, during acquisition of the data, the data is deposited into k-space (e.g., a line is filled in k-space). However, it should be noted that the manipulation of data in image space in accordance with the present approaches is also contemplated. In such instances, the data in k-space may be converted to data in image space to generate a first T1ρ weighted image.

Upon acquiring the first data set (block 94), which may a line or a section of data in k-space or image space, the second preparatory pulse sequence may be performed (block 96). After providing a crusher gradient to eliminate any remaining transverse magnetization, a second data set is acquired (block 98) in a similar manner as described above. Further, in some embodiments, the data in k-space may be converted to data in image space to generate a second T1ρ weighted image.

Upon acquisition of the second data set, one data set is subtracted from the other (block 100). According to the present approaches, the steps within blocks 92-100 may be performed for a section or line of k-space. However, the present method may also be performed by acquiring one full set of k-space data (e.g., the first data set) followed by acquisition and subtraction of the other (e.g., the second data set). Further, while the subtraction function is described as being performed by subtracting the second data set from the first, it should be noted that the subtraction may be performed in the opposite arrangement.

After a first and second data set (e.g., MR data, image data) have been acquired, which may be a line, or section of k-space, the spin-locking duration (TSL) of both the first and second preparatory pulses 70 and 72 may be changed, followed by acquisition of the same section of k-space acquired in blocks 94 and 98 (block 102). In this way, motion artifacts may be minimized. In a general sense, TSL is varied and blocks 92-100 are performed until all of k-space has been acquired for all TSL variations (block 102). Further, while the present embodiment may utilize full k-space, it is also contemplated that filling only a portion of k-space is also presently contemplated. Additionally, while the illustrated method 90 changes TSL after subtracting one data set from another, it should be noted that the acquisition of full or partial k-space or image space data sets and the variance of TSL prior to performing subtraction (block 100) is also contemplated.

As noted above, the degree of T1ρ weighting may change as TSL is varied. Such variance in T1ρ weighting may be utilized to quantify T1ρ, as discussed below. In a general sense, the more TSLs utilized, the more accurate the quantification of T1ρ (i.e., the better fit to an exponential decay model). According to the embodiments presented herein, at least 2 TSLs, at least 3 TSLs, at least 4 TSLs, or more may be utilized. In present embodiments, the iteration of blocks 92-100 may be performed using at least 4 different TSLs to acquire a desired number of data sets for T1ρ quantification. As an example, the TSL may vary between approximately 0 and 100 milliseconds (e.g., about 0, 20, 40, 60, 80, or 100 milliseconds).

In the iterations described above, the subtraction of one data set from the other may be performed in image space or data space (e.g., k-space) on a pixel-by-pixel basis. To obtain a T1ρ value for each pixel, data acquired at the same TSL are utilized for the subtraction function. As an example, a second T1ρ weighted data set acquired utilizing a TSL of 20 ms during the second preparatory pulse may be subtracted from a first T1ρ weighted data set acquired utilizing a TSL of 20 ms during the first preparatory pulse sequence 70. In this way, T1ρ value resulting from TSL variation may be determined on a pixel-by-pixel basis. Further, it should be noted that banding and/or T2ρ terms may be characterized by performing an addition function rather than a subtraction function.

Utilizing the resultant data sets after subtraction, T1ρ is quantified (block 104). As an example, the difference data for each pixel may be plotted as a function of TSL. The resultant plot is fitted to an exponential decay function, and the T1ρ value is determined, with the T1ρ value being the decay constant in some embodiments. This process is performed on a pixel-by-pixel basis to generate a T1ρ value for each pixel. Thus, once T1ρ is quantified, a T1ρ map may be generated (block 106). The map may be used on its own, may be superimposed on a different MRI scan or other scan such as a CT image, an X-ray image, and the like. Such mapping and overlaying may aid in clinical diagnoses of changes in macromolecular content of the tissue, such as the loss of proteoglycan in osteoarthritic tissue.

Figure 4:
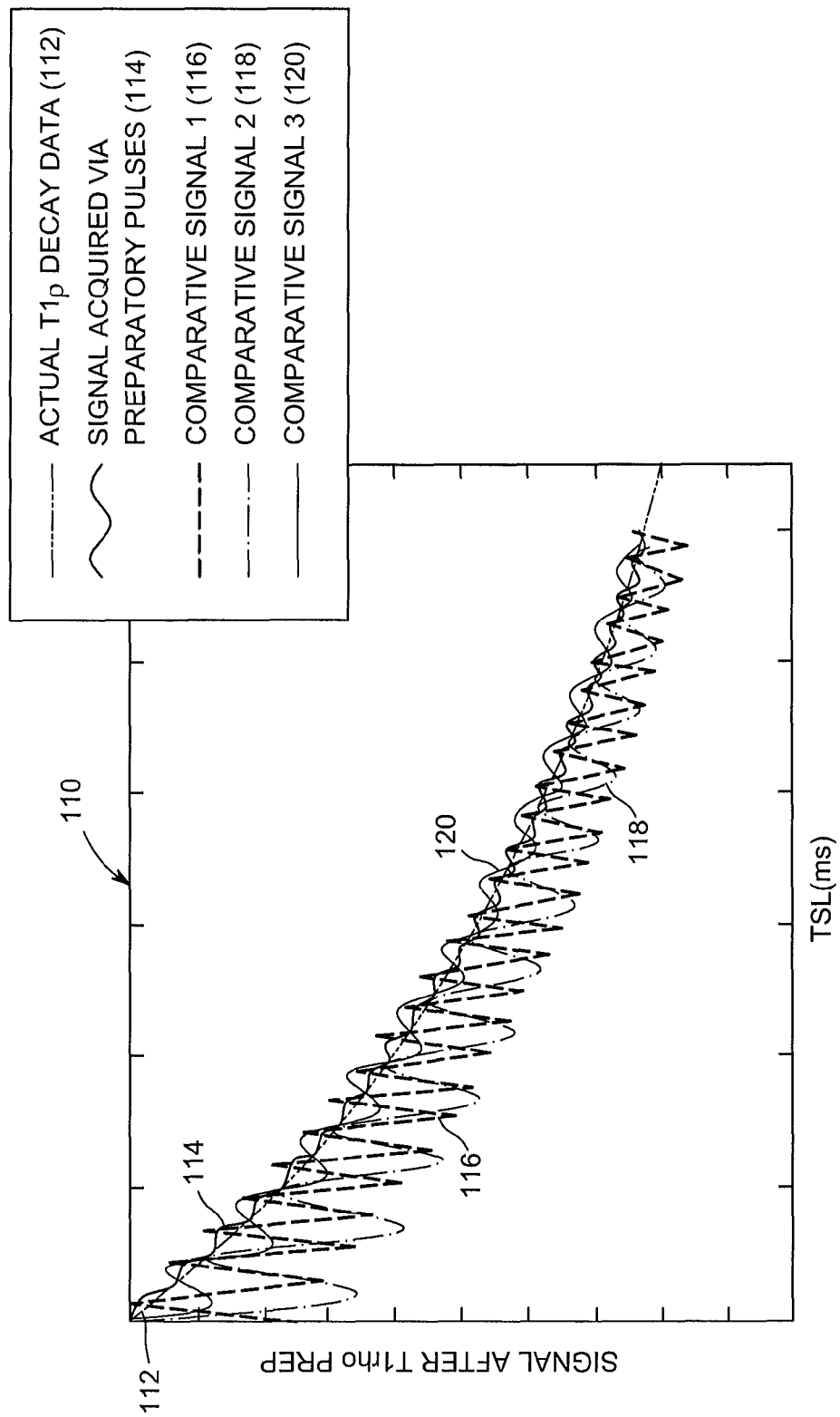
FIG. 4 is an illustration of signals at varying TSL resulting from different T1ρ preparation pulse schemes compared to the signal at varying TSL using the T1ρ preparation pulse schemes presented in FIG. 3.

FIG. 4 provides a graph 110 of the signal that results from different T1ρ preparatory approaches using a Bloch simulation. To estimate the ability of the various preparatory sequences to accurately quantify T1ρ, inhomogeneity was induced in simulated B0 and B1 RF fields. In the illustrated example, the actual B1 RF value was manipulated to 80% of the expected value and B0 was adjusted to be 80 Hz off-resonance. For comparison, actual T1ρ decay data is provided in a line 112. Line 114 corresponds to acquired signal after performing the preparatory pulses described above with respect to FIG. 2. Lines 116, 118, and 120 correspond to prior art methods for acquiring such data. Specifically, the data presented in the graph 110 include acquired signal after T1ρ preparation as a function of spin lock time (TSL).

It should be noted that the presence of B0 and B1 RF inhomogeneity may induce signal oscillation after the preparatory pulse sequence has been completed. Therefore, the greater the oscillation of the simulated data (the greater the amplitude of the oscillations), the less accurate the method may be for quantifying T1ρ. Accordingly, it may be appreciated with reference to FIG. 4 that the line 114 corresponding to the pulse sequences described herein exhibits a marked decrease in oscillation when compared to the prior art representative lines 116-120. In this way, it is believed that the present approaches provide greater correction for B0 and B1 RF inhomogeneities compared to prior art approaches.

Figure 5:
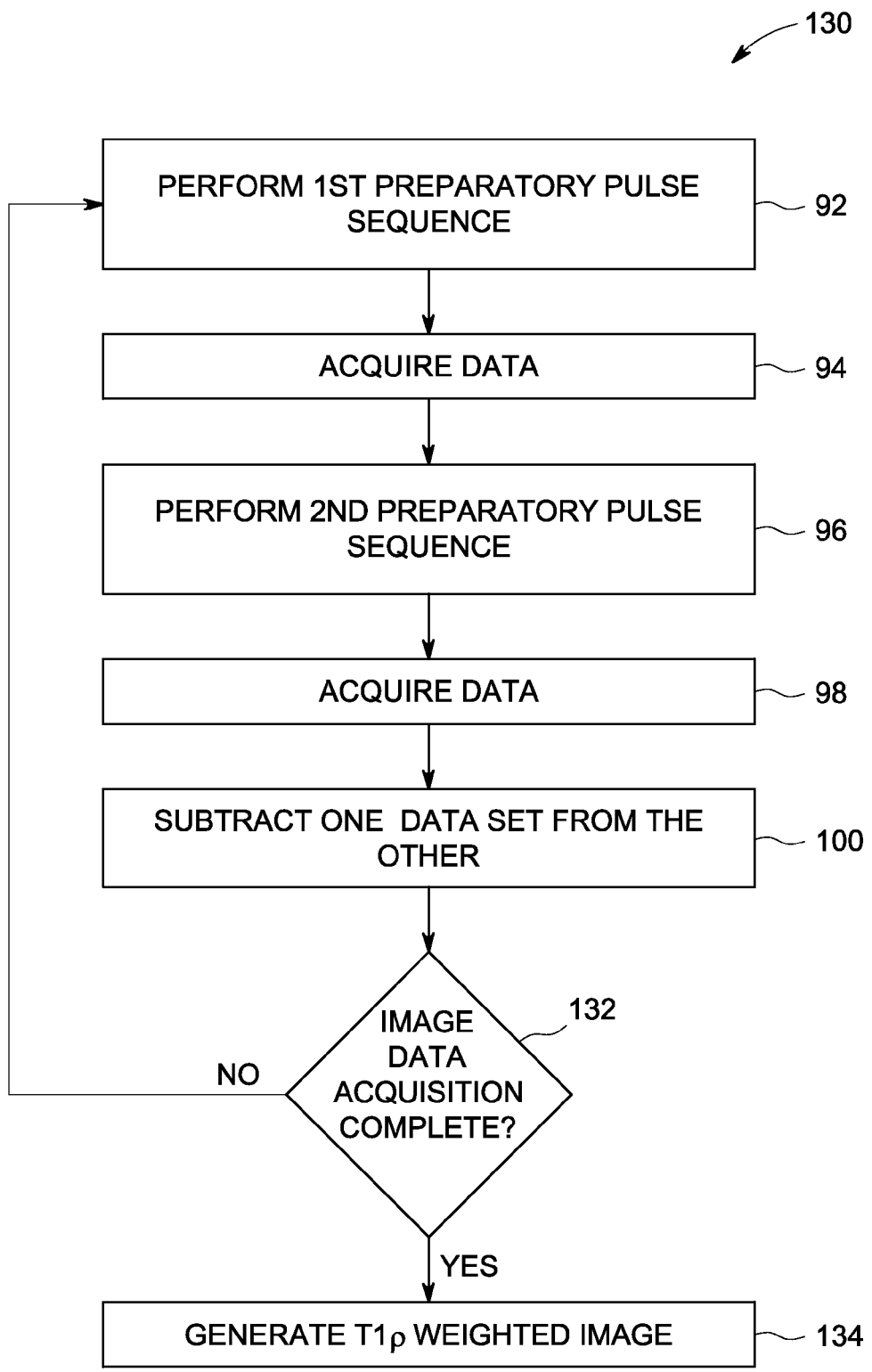
FIG. 5 is a process flow diagram of a method of generating a T1ρ weighted image using the preparatory pulse sequences of FIG. 2.

In addition to or in lieu of T1ρ quantification, it may be desirable to generate a T1ρ weighted image utilizing the present approaches. Such a T1ρ weighted image may have improved B0 and B1 RF field inhomogeneity compensation compared to existing techniques, as illustrated in the comparative example of FIG. 4. Thus, in accordance with present embodiments, FIG. 5 illustrates a process flow diagram of a method 130 for generating a T1ρ weighed image utilizing the preparatory pulse sequences described with respect to FIG. 2. As discussed above, the method 130 may be performed in addition to or in lieu of the method 90 illustrated in FIG. 3. However, the method 130 begins with a series of steps that is substantially the same as those described above with respect to FIG. 3. Specifically, method 130 includes performing the first preparatory pulse sequence 70 (block 92), acquiring a first set of MR data (block 94), performing the second preparatory pulse sequence 72 (block 96), acquiring a second set of MR data (block 98), and subtracting one data set from the other (block 100).

After the acts represented by blocks 92-100 are performed, a determination is made as to whether data acquisition is complete (query 132). For example, the data acquisition performed in blocks 92-100 may result in a single line of k-space being filled with the difference data resulting from the subtraction performed in block 100. Thus, a different portion of k-space is sampled in subsequent iterations of blocks 92-100. Thus, in embodiments where the acquisition is incomplete, the method 130 cycles back to performing the first preparatory pulse sequence (block 92). It should therefore be noted that blocks 92-132 may cycle until the desired amount of data has been collected. In one embodiment, the method may cycle through blocks 92-132 until all of k-space has been filled. In other embodiments, the method 130 may cycle through blocks 92-132 until a desired portion of k-space (e.g., areas of low spatial frequency) has been filled. In embodiments where the data acquisition is complete, the method 130 may progress to generating a final T1ρ weighted image from the difference data. For example, in embodiments where the data is in k-space, the difference data may be transformed (e.g., by inverse Fourier Transform) to generate an image.

While the illustrated embodiment of method 130 presents the image subtraction step (block 100) before the query 132, it should be noted that other arrangements are also contemplated. For example, the filling all of k-space for each data set followed by subtraction of one full k-space data set from the other, the subtraction of portions of k-space data sets from each other, and the like are presently contemplated. Further, the data acquired in blocks 94 and 98 may be utilized to generate respective first and second T1ρ weighted images, with the subtraction step (block 100) being performed to generate a difference image. Indeed, any combination of partial or total sampling, partial or total image construction, partial or total subtraction and so forth are presently contemplated when utilizing the preparatory pulse sequences described herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method comprising:
   (a) performing a first magnetic resonance imaging sequence with a magnetic resonance imaging system, the sequence comprising:
      (i) a first preparatory composite spin locking pulse sequence having a spin lock pulse bounded by similarly oriented spin tipping pulses; and
      (ii) an acquisition pulse sequence to acquire first magnetic resonance data;
   (b) performing a second magnetic resonance imaging sequence with the magnetic resonance imaging system, the sequence comprising:
      (i) a second preparatory composite spin locking pulse sequence having a spin lock pulse bounded by oppositely oriented spin tipping pulses; and
      (ii) an acquisition pulse sequence to acquire second magnetic resonance data; and
   (c) storing the magnetic resonance data in a memory circuit.

2. The method of claim 1, wherein a portion of the first and second preparatory pulse sequences comprising the spin lock pulses comprises B0 and B1 inhomogeneity compensation.

3. The method of claim 1, comprising (d) determining difference data from the first and second magnetic resonance data and storing the difference data.

4. The method of claim 3, wherein the difference data substantially removes T2ρ contamination.

5. The method of claim 3, comprising performing steps (a) and (b) repeatedly and generating the difference data based upon multiple sets of image data resulting from the repeated performance of steps (a) and (b).

6. The method of claim 5, wherein for at least two of the repetitions of steps (a) and (b) different spin lock pulse durations (TSL) are utilized.

7. The method of claim 6, wherein each of the TSL provides different T1ρ weighting.

8. The method of claim 7, comprising quantifying T1ρ on a pixel-by-pixel basis using the difference data.

9. The method of claim 8, comprising generating a T1ρ map consisting of T1rho value of a subject of interest on a pixel-by-pixel basis.

10. The method of claim 1, wherein step (a) is performed before step (b).

11. The method of claim 1, wherein step (b) is performed before step (a).

12. The method of claim 3, wherein step (d) is performed on data in k space.

13. The method of claim 3, wherein step (d) is performed on data in image space.

14. A magnetic resonance imaging method comprising:
   (a) performing a first magnetic resonance imaging sequence with a magnetic resonance imaging system, the sequence comprising:
      (i) a first preparatory composite spin locking pulse sequence having a spin lock pulse bounded by similarly oriented spin tipping pulses; and
      (ii) an acquisition pulse sequence to acquire first magnetic resonance data;
   (b) performing a second magnetic resonance imaging sequence with a magnetic resonance imaging system, the sequence comprising:
      (i) a second preparatory composite spin locking pulse sequence having a spin lock pulse bounded by oppositely oriented spin tipping pulses; and
      (ii) an acquisition pulse sequence to acquire second magnetic resonance data;
   (c) generating difference data on a pixel-by-pixel basis from the first and second data as the data is collected;
   (d) storing the difference data in a memory circuit.

15. The method of claim 14, comprising performing steps (a) and (b) repeatedly and generating a plurality of difference data values for each pixel based upon multiple sets of data resulting from the repeated performance of steps (a) and (b), wherein for at least two of the repetitions of steps (a) and (b)

different spin lock pulse durations (TSLs) are utilized to provide different T1ρ weighting for each of the first and second magnetic resonance data.

16. The method of claim 15, comprising generating a plot of acquired signal as a function of TSL and fitting an exponential curve to the plot to quantify T1ρ for each pixel, wherein the quantified T1ρ is used to generate a T1ρ map of the subject of interest.

17. The method of claim 14, wherein one iteration of steps (a), (b), and (c) results in one line of k-space being filled with the difference data.

18. The method of claim 14, comprising generating a T1ρ weighted image from the difference data.

19. A magnetic resonance imaging system comprising:
   a primary field magnet;
   a set of gradient field coils;
   a radiofrequency field coil;
   control circuitry coupled to the gradient field coils and to the radiofrequency field coil, the control circuitry configured to apply control signals to the gradient and radiofrequency coils in order to perform a magnetic resonance imaging sequence comprising:
   (a) a first magnetic resonance imaging sequence comprising:
      (i) a first preparatory composite spin locking pulse sequence having a spin lock pulse bounded by similarly oriented spin tipping pulses; and
      (ii) an acquisition pulse sequence in order to acquire first magnetic resonance data;
   (b) a second magnetic resonance imaging sequence comprising:
      (i) a second preparatory composite spin locking pulse sequence having a spin lock pulse bounded by oppositely oriented spin tipping pulses; and
      (ii) an acquisition pulse sequence in order to acquire second magnetic resonance data; and processing circuitry configured to determine difference data from the first and second magnetic resonance data in order to characterize T1ρ Data for a subject of interest.

20. The system of claim 19, wherein the processing circuitry is configured to subtract the first magnetic resonance data from the second magnetic resonance data as the first magnetic resonance data is acquired and deposited into k-space in order to determine the difference data, or to subtract the second magnetic resonance data from the first magnetic resonance data as the second magnetic resonance data is acquired and deposited into k-space in order to determine the difference data.

* * * * *